United States Patent [19]

Murakami et al.

[11] Patent Number: 5,430,010
[45] Date of Patent: Jul. 4, 1995

[54] PROCESS FOR PREPARING OXIDE SUPERCONDUCTOR

[75] Inventors: Masato Murakami; Terutsugu Oyama; Hiroyuki Fujimoto; Naoki Koshizuka; Yu Shiohara; Shoji Tanaka, all of Tokyo, Japan

[73] Assignees: International Superconductivity Technology Center; Nippon Steel Corporation, both of Tokyo, Japan

[21] Appl. No.: 73,656

[22] Filed: Jun. 8, 1993

Related U.S. Application Data

[63] Continuation of Ser. No. 606,207, Oct. 30, 1990, abandoned.

[30] Foreign Application Priority Data

Nov. 2, 1989 [JP] Japan ................................. 1-286760
Dec. 21, 1989 [JP] Japan ................................. 1-329489
May 17, 1990 [JP] Japan ................................. 2-127502

[51] Int. Cl.$^6$ ..................... H01B 12/00; H01L 39/12
[52] U.S. Cl. ..................... 505/450; 505/725; 505/733; 505/742; 505/490; 252/518; 252/521
[58] Field of Search ........... 505/725, 733, 742, 1; 252/518, 521

[56] References Cited

U.S. PATENT DOCUMENTS

| | | | |
|---|---|---|---|
| 4,971,946 | 11/1990 | Taylor | 505/725 |
| 5,017,548 | 5/1991 | Hirakawa | 505/725 |
| 5,114,914 | 5/1992 | Sablik et al. | 505/1 |

FOREIGN PATENT DOCUMENTS

| | | |
|---|---|---|
| 0319807 | 6/1989 | European Pat. Off. |
| 0358530 | 3/1990 | European Pat. Off. |
| 0374263 | 6/1990 | European Pat. Off. |
| 0427209 | 5/1991 | European Pat. Off. |

OTHER PUBLICATIONS

Meng et al, "Manufacture of Bulk Superconducting $YBa_2(Cu_3O_{7-\delta}$ by A Continuous Process," *Nature* vol. 345, 24 May 1990.

Kaiser et al, "Growth of $YBa_2Cu_3O_x$ Single Crystals," *App. Phys. Lett.* vol. 51, No. 13, 28 Sep. 1987.

Sawano et al, "Effects of Synthesis Conditions on Microstructure of A $YBa_2Cu_3O_x$ Superconductor ... ", *Nip. Ser. Ky. Gak. Rin.* vol. 97(10), 1989.

Jin et al, "Large Magnetic Hysteresis in a Melt-Textured Y-Ba-Cu-O Superconductor", *Appl. Phys. Let.* vol. 54, No. 6, 6 Feb. 1989.

Hirano et al, "Thermal Behavior of Melt-Quenched Products of $YBa_2Cu_3O_{7-\delta}$ Compound," *Nippon Seram.* vol. 96, No. 4, pp. 509–511, Apr. 1, 1988.

Kase et al, "Preparation of Y-Ba-Cu-O Superconduc-
(List continued on next page.)

Primary Examiner—Paul Lieberman
Assistant Examiner—M. Kopec
Attorney, Agent, or Firm—Wenderoth, Lind & Ponack

[57] ABSTRACT

The present invention relates to a process for preparing an oxide superconductor having a high critical current density, a uniform structure and an excellent mechanical property and thermal stability, which comprises heating raw material powders of a REBaCuO system at 1050° C. or higher, cooling the material for solidification, pulverizing and mixing the solidified material to homogeneously disperse the structure of the solidified material, molding the material, optionally mixed with silver oxide or silver, into a predetermined shape, and reheating the molding to 1050° C. or higher to grow a superconducting phase.

8 Claims, 5 Drawing Sheets

OTHER PUBLICATIONS tors with High Critical Current Density . . . ," *Jap. Jrnl. App. Phys.*, vol. 29, No. 2, Feb. 1990, pp. L277–L279.

Masato Murakami et al., "A New Process with the Promise of High $J_c$ in Oxide Superconductors", Japanese Journal of Applied Physics vol. 28, No. 7, Jul., 1989, pp. 1189–1194.

Masato Murakami et al., "Microstructural Study of the Y–Ba–Cu–O System at High Temperatures", Japanese Journal of Applied Physics vol. 28, No. 3, Mar., 1989, pp. L399–L401.

P. A. Curreri et al., "High $T_c$ Composite Silver/Oxide Superconductors", Metallurgical Transactions A, vol. 21A, Jan. 1990, pp. 257–260.

Applied Physics Letters, vol. 52, No. 24, Jun. 13, 1988, pp. 2066–2067.

Physical Review B, vol. 37, No. 13, May 1, 1988, pp. 7850–7853.

Patent Abstracts of Japan, JP-A-63-276819, Nov. 15, 1988.

Derwent Publications, Accession No. 89-012366, Nov. 25, 1988, London.

Chemical Abstracts, vol. 109, No. 6, Aug. 8, 1988, p. 295 (Abstract No. 109:42415p).

Murakami et al., Japanese Journal of Applied Physics, vol. 28, No. 7, Part 1, Jul. 1989, pp. 1189–1194.

Sawano et al., Journal of the Ceramic Society of Japan, vol. 97, No. 10, Oct. 1989, pp. 54–58.

PROCESS FOR PREPARING OXIDE SUPERCONDUCTOR

This application is a continuation of now abandoned application Ser. No. 07/606,207, filed Oct. 30, 1990.

BACKGROUND OF THE INVENTION (1) Field of the Invention

The present invention relates to a process for preparing an oxide superconductor having a high critical current density. More particularly, the present invention relates to a process for preparing an oxide superconductor wherein fine $RE_2BaCuO_5$ is homogeneously dispersed in a superconducting phase.

(2) Description of the Related Art

The discovery of an oxide superconductor of a YBaCuO system having a critical temperature ($T_c$) exceeding 90K has enabled liquid nitrogen to be used as a cooling agent, and this has led to research into ways in which such a superconductor can be put to practical use. Currently, however, the oxide superconductor of the type described above has a low critical current density ($J_c$), which is of the utmost importance from the viewpoint of practical use, and thus a practical use for the oxide superconductor in a liquid nitrogen atmosphere has not yet been found.

Recently, it has become possible to obtain a critical current density exceeding 10000 $A/cm^2$, i.e., a critical current density close to a level necessary for practical use in a magnetic field as high as 1 tesla (T), through the formation of a superconducting phase from a molten state (see M. Murakami et al., Japanese Journal of Applied Physics, Vol. 28, 1989, p. 1189).

This method focuses on the phenomenon that a superconducting phase ($YBa_2Cu_3O_x$) is formed by a peritectic reaction of $Y_2BaCuO_5O_x$ (hereinafter referred to as "211 phase") with a liquid phase, the growth of the superconducting phase is accelerated by means of finely and homogeneously dispersing a 211 phase in a liquid phase, and at the same time, a 211 phase capable of serving as a pinning center can be successfully dispersed in the superconducting phase. The 211 phase is homogeneously and finely dispersed by a treatment which comprises rapidly heating the system to a temperature as high as at least 1200° C. and then quenching the system, to thereby finely disperse the $Y_2O_3$ serving as a nucleus of the formation of the 211 phase.

When the above-described conventional means is used, however, there is a tendency for $Y_2O_3$ to agglomerate and form a large mass when the system is heated to 1200° C. or higher. Further, since $Y_2O_3$ is heavier than the liquid phase, it sinks below the liquid phase, and thus it becomes difficult to homogeneously disperse the $Y_2O_3$. Further, limitations on the shape of the quenched material have made it difficult to prepare a molding having a desired shape.

The present invention has been created with a view to solving the above-described problems.

SUMMARY OF THE INVENTION

Therefore, an object of the present invention is to provide a process for preparing an oxide superconductor wherein fine $RE_2BaCuO_5$ is homogeneously dispersed in a superconducting phase.

Another object of the present invention is to prepare an oxide superconductor having a high critical current density.

A further object of the present invention is to prepare an oxide superconductor having a desired shape and a uniform critical current density.

A further object of the present invention is to prepare an oxide superconductor having an improved mechanical property and thermal stability.

To attain the above-described objects, the present invention is characterized by heat-melting at a high temperature raw material powders for forming an oxide superconductor of a REBaCuO system, wherein RE is a rare earth element including yttrium, or a material prepared by the conventional sintering; quenching the resultant melt to form a solidified material; pulverizing the material; stirring and sufficiently mixing the powder to ensure that the $RE_2O_3$ or $RE_2BaCuO_5$ phase is finely and homogeneously dispersed in a liquid phase when the mixture of a REBaCuO system is reheated to 1050° C. or higher; molding the mixture to a desired shape; and again heating the molding to grow a superconducting phase.

Further, the present invention is characterized by melting the raw materials for an oxide superconductor of a REBaCuO system only, solidifying the melt, pulverizing the solidified material, and adding silver or silver oxide to the powder while mixing the powder, to thereby prepare a precursor containing silver or a silver oxide finely dispersed therein, molding the mixture to a predetermined shape, and again heating the molding to grow a superconducting phase.

DESCRIPTION OF THE PREFERRED EMBODIMENTS

Figure 1:
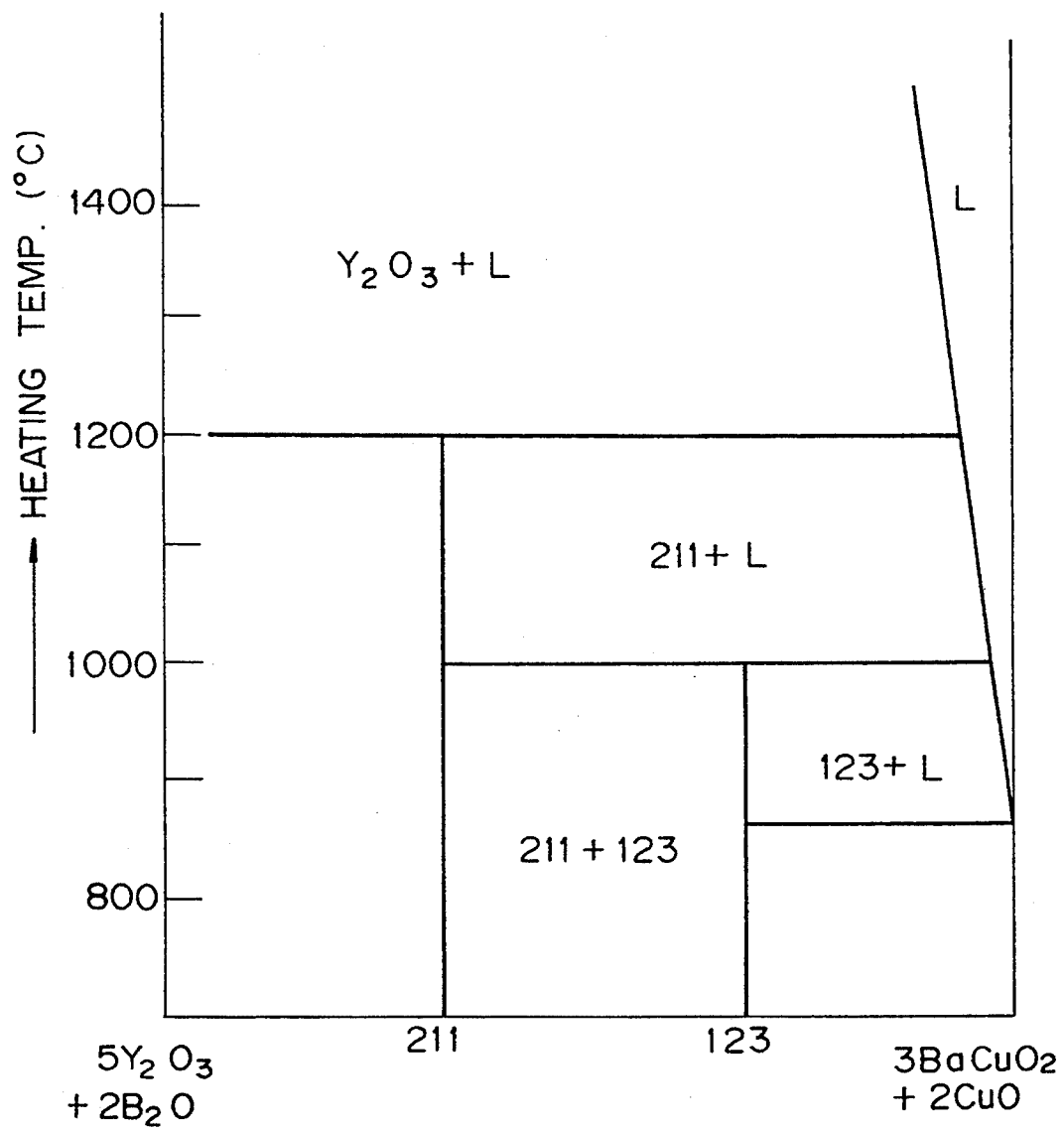
FIG. 1 is a pseudo-binary diagram of an oxide superconductor of a REBaCuO system wherein RE is a rare earth element including yttrium.

It is known that, as shown in FIG. 1 (pseudo-binary diagram), a superconducting phase is formed through a reaction of a 211 phase with a liquid phase (BaO or $BaCuO_2$ and CuO) (see M. Murakami et al., Japanese Journal of Applied Physics, Vol. 28, 1989, L399). To obtain a continuous growth of a superconducting phase, however, it is necessary to feed both the 211 phase and the liquid phase, and accordingly, the 211 phase must be finely and homogeneously dispersed in the liquid phase. A dispersion of $RE_2O_3$ serving as a nucleus of formation of a 211 phase in the liquid phase followed by formation of a 211 phase through reheating is one known method of homogeneous dispersion.

In the prior art, this type of structure has been formed by rapidly heating the system to a stable region of the $RE_2O_3$ and liquid phase L shown in FIG. 1, and then quenching the melt to solidify same. As described above, however, a problem arises with the use of $Y_2O_3$, in that it tends to agglomerate and form a large mass, and therefore, it becomes difficult to prepare a homogeneously dispersed structure. Namely, the product according to the prior art is only partially homogeneous, and on the whole is heterogeneous.

It has been found through research by the inventors that, even when the system has a heterogeneous region in a quenched state, it is possible to obtain a larger homogeneously dispersed state than quenched state.

Specifically, it has been found that, when a quenched agglomerate containing $RE_2O_3$ heterogeneously dispersed therein is pulverized and mixed, to mechanically obtain a homogeneous dispersion of $RE_2O_3$, a more homogeneously developed superconducting structure can be formed by reheating the mixture as formed to a temperature region of 1050° to 1200° C. at which a 211 phase is formed.

Further, it has been found that, it becomes unnecessary to solidify the high temperature structure of the material as is after heating, by quenching. Specifically, even when the melt is allowed to stand in air while the melt is in a crucible, the same structure can be obtained when a pulverizing and a mechanical mixing for a homogeneous dispersion of $RE_2O_3$ are carried out after solidification.

Conversely to the case where no pulverization is conducted, a structure wherein a 211 phase is much more homogeneously dispersed in a liquid phase can be formed by heating the system to a region of $RE_2O_3$ and a liquid phase, i.e., a region of 1200° C. or higher, quenching the melt or allowing the melt to stand in the air, pulverizing the cooled material to a particle size of 0.1 to 50 μm, thoroughly stirring and mixing the powder until the $RE_2O_3$ is finely and homogeneously dispersed, molding the mixture to a desired shape, and reheating the molding to a temperature region wherein a 211 phase is formed, i.e., a temperature of 1050° to 1200° C. When the melt in this state is gradually cooled to a temperature region of 950° to 1000° C. wherein a superconducting phase is formed, an oxide superconductor comprising a well developed superconducting phase and a finely dispersed 211 phase can be prepared.

When the material is cooled after heating to a region wherein the 211 phase and the liquid phase L coexist, as shown in FIG. 1, the structure as quenched or air-cooled becomes more heterogeneous than in the case of the $RE_2O_3$-L coexistence. In this case also, however, a structure wherein the 211 phase is homogeneously dispersed can be prepared by pulverizing the cooled material and mechanically mixing the powder. When the mixture is reheated to grow a superconducting phase, an oxide superconductor comprising a well developed superconducting phase and a fine 211 phase dispersed therein can be prepared in the same manner as described above. Note, in both cases it is possible to obtain a very high critical current density ($J_c$) of 30000 A/cm$^2$ or more.

Therefore, the present invention enables not only a relatively simple forming of a precursor structure having a homogeneously dispersed 211 phase but also a preparing of various moldings by the melting process.

The steps of the process of the present invention will now be specifically described.

Raw material powders for a superconducting material of a REBaCuO system, i.e., raw material powders for the $RE_2P_3$, such as $Y_2O_3$ and $Ho_2O_3$, and other raw material powders, such as $BaCO_3$ and $CuO$, are held at 1200° to 1500° C. for 1 to 60 min to form a $RE_2O_3$ phase and a liquid phase (comprising BaO, $BaCuO_2$+CuO, etc.), or at 1050° to 1200° C. for 15 to 60 min to form a 211 phase and a liquid phase. The resultant material is cooled at a cooling rate obtained by air-cooling or at a more rapid rate.

The thus formed solidified materials are each pulverized to a particle size of 0.1 to 50 μm and sufficiently stirred and mixed to ensure that the $RE_2O_3$ or $RE_2BaCuO_5$(211) phase is finely and homogeneously dispersed in a liquid phase when the mixture of a REBaCuO system is reheated to thereby prepare a fine mixed powder. Subsequently, that powder is molded into a desired shape and reheated.

Then, the above-described molding is heated at 1050° to 1200° C., at which a 211 phase is formed, held at that temperature for 15 to 60 min, cooled from that temperature to 1000° C. at a cooling rate of 10° to 1000° C./hr, and further, gradually cooled to 950° C. at a cooling rate of 0.2° to 20° C./hr.

The molding is then subjected to cooling from 950° C. to room temperature at any cooling rate, and thereafter, during the cooling to room temperature, if it becomes necessary to conduct oxygenation, the material is heat-treated in such a manner that it is held in an $O_2$-enriched atmosphere at 600° to 200° C. for 2 to 200 hr or is substantially gradually cooled in a temperature region of from 600° C. at highest to 200° C. at lowest, from 2 to 200 hr, and then subjected to cooling at any cooling rate.

When a superconducting material is to be practically applied, in many cases it must have not only a critical current density but also a high mechanical property and stability, etc. As with ceramics, the oxide superconductor inherently has a low toughness, and it is reported that the material is susceptible to cleaving even in a single crystal form. The dispersion of the 211 phase in the liquid phase also has the effect of preventing the appearance of cracks, but since the material is a kind of ceramic, the effect is limited and is not satisfactory on the whole.

The thermal stability of the superconducting material often becomes a problem, and accordingly, when a part of the superconductor becomes a normal conductor and thus generates heat, the whole of the superconductor is changed to the normal conductor portion if this heat is rapidly removed by a cooling agent, whereby the superconducting state is lost. In the conventional superconducting wire, this problem has been solved by forming a composite with copper having an excellent heat conductivity in situ. Nevertheless, in the case of ceramic per se, a problem of thermal stability also arises.

The formation of a composite with a metal has been proposed as a means of improving the mechanical property and the thermal stability; for example, a method wherein a superconducting powder is packed into a silver sheath and then subjected to wire drawing. In this method, if the wire diameter is small enough, the shape of the wire can be maintained due to the strength of silver. Further, since silver has an excellent thermal conductivity, it also has the effect of improving the thermal stability.

A direct addition of silver to the oxide superconductor is disclosed in, e.g., METALLURGICAL TRANSACTION A (Vol. 21A, Jan. 1990, pp. 257-260) wherein silver is added by dissolution process, and further, a report has been made on an attempt to add silver by a sintering process. In these methods, the silver is coarsely segregated in the matrix (silver having a size of 50 to 100 μm is segregated as shown in a microphotograph of FIG. 5 in the above-described reference), and thus a desired superconducting property can not be obtained.

The present inventors noted that silver has an advantage of not causing a lowering of the superconducting property of the matrix, and further, has a superior thermal conductivity, and found that the thermal conductivity can be improved if the silver can be properly dispersed in the superconductor. It was also found that a fine dispersion of silver in the matrix provides an improved mechanical property due to a relaxation of strain caused by a deformation of the dispersed silver.

Specifically, the present inventors succeeded in improving the mechanical property and thermal stability of the oxide superconductor by providing a fine dispersion of silver in the matrix while maintaining the dispersion of the 211 phase in the liquid phase in the above-described steps, i.e., melting.solidification→pulverization.mixing→reheating.

The steps of this embodiment will now be specifically described.

The proportions of powders of raw materials of a REBaCuO system are properly regulated, heated at 1200° C. or higher, cooled for solidification, the solidified melt is pulverized, $Ag_2O$ or Ag is added to and mixed with the resultant powder, and the mixture is molded, reheated at 1050° to 1200° C., cooled to 1000° C., and further, gradually cooled from 1000° to 950° C.

The above-described process enables not only the preparation of an oxide superconductor of a REBaCuO system as shown in FIG. 2, wherein silver is finely dispersed in a superconducting matrix, but also the preparation of a molding having a desired shape.

Figure 2B:
FIGS. 2(a) and (b) are microphotographs showing the texture of an oxide superconductor of a REBaCuO system prepared by the process according to the present invention.
Figure 2A:
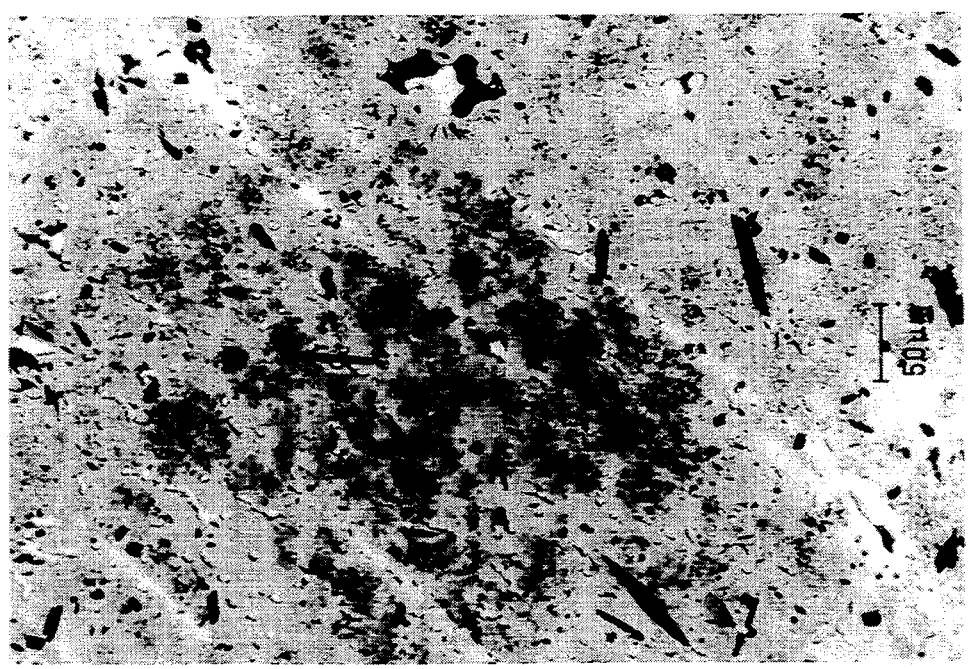

FIG. 2(a) is a microphotograph showing a 211 phase finely dispersed in the superconducting phase, and FIG. 2(b) is a similar microphotograph showing silver finely (average particle diameter: about 5 $\mu$m) dispersed in the superconducting phase. It is apparent that the dispersion of silver according to the present invention is much finer, as opposed to the conventional 10 structure wherein the average particle diameter is 50 to 100 $\mu$m and the cracks cannot be effectively prevented. The above-described fine dispersion of silver prevents the cracks and further, improves the thermal conductivity, to thereby improve the thermal stability. Further, it also becomes possible to obtain an effect such that the finely dispersed silver serves as a new pinning point.

Figure 3:
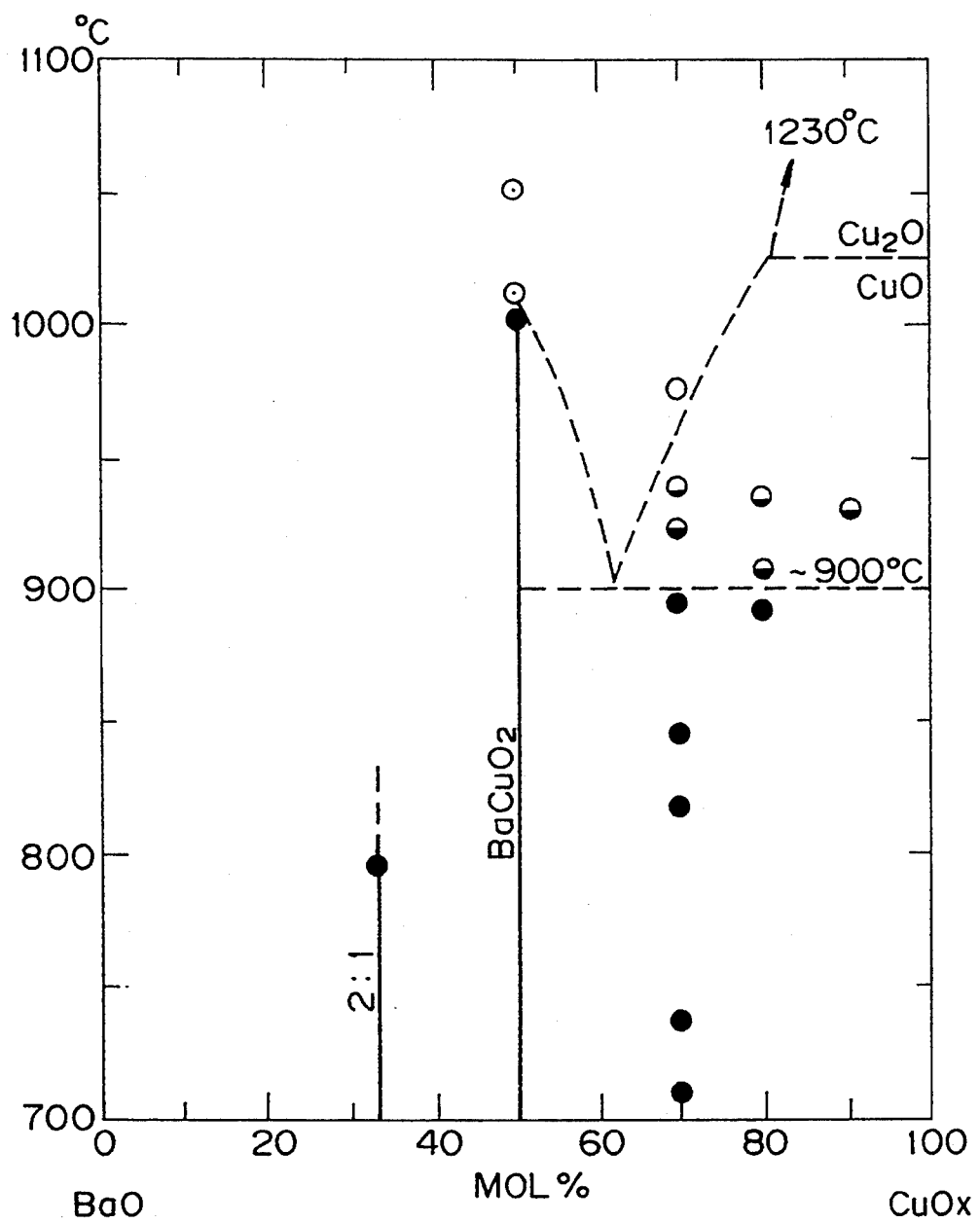
FIG. 3 is a phase diagram of a $BaO.CuO_x$ system.

Further, the present inventors have found that a superconducting phase can be formed by later adding a $RE_2O_3$ or 211 phase to a liquid phase in a molten state (see FIG. 3). As seen from FIG. 3, a liquid phase can be obtained at about 900° C., through the utilization of a eutectic mixture of $BaCuO_2$ with $CuO_x$, and when the temperature is gradually lowered from this state to a temperature region of from 1000° to 950° C. wherein a superconducting phase is formed, it is possible to prepare an oxide superconductor comprising a well developed superconducting phase and a 211 phase dispersed therein.

Specifically, raw material powders, i.e., $BaCO_3$ and CuO powders, etc., are mixed with each other, the mixture is calcined at about 900° C., the calcined material is heated at 950° to 1200° C. to be melted, $RE_2O_3$ powder is added to the molten material, this state is held for a predetermined time, and the material is then cooled. This process is suitable for the formation of a material having a continuous length, such as a wire rod, at a low temperature region. Also, in this case, a critical current density ($J_c$) of as high as 20000 A/cm$^2$ can be obtained (see Examples 5 and 6).

Alternatively, the following procedures may be conducted. Powders of raw materials of a REBaCuO system are premixed with each other, the mixture is subjected to presintering, the calcined material is reheated to 1050° to 1200° C. to form a 211 phase, and then $BaCO_3$ and CuO raw material powders are separately mixed, calcined, and heated to about 1100° C. to melt the mixture. The above-described 211 phase is added to the resultant melt, held at that state for a predetermined time, and then cooled (See Example 7).

EXAMPLES

Example 1

Figure 4:
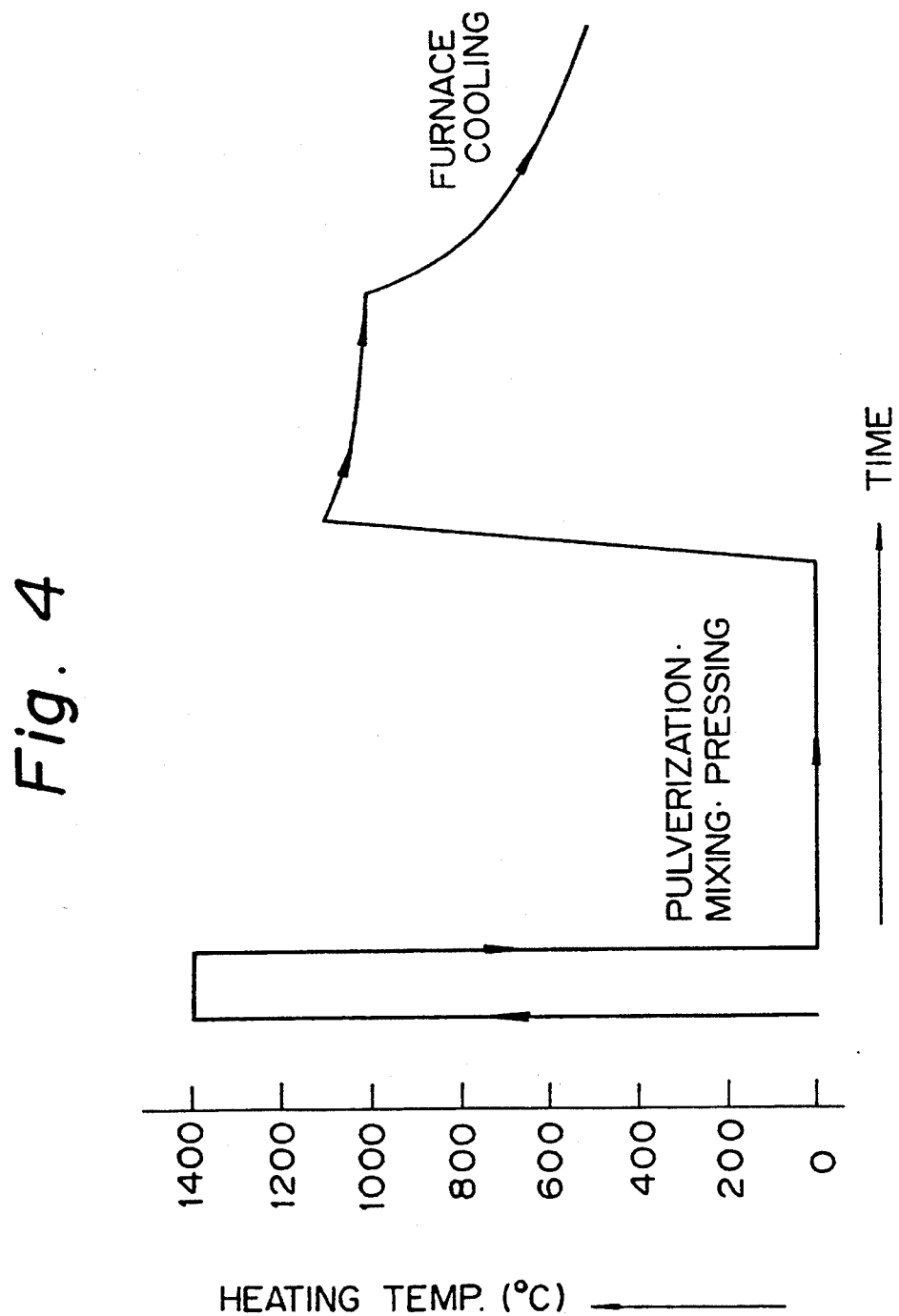
FIG. 4 is a schematic diagram showing a superconductor of a YBaCuO system prepared in Example 1.

In Example 1, an oxide superconductor was prepared as shown in FIG. 4 (a schematic diagram of the process). Specifically, $Y_2O_3$, $BaCO_3$, and CuO powders as a raw material powder were mixed such that the ratio of Y, Ba, and Cu was 1:2:3. The mixture was calcined at 900° C. for 24 hr, heated at 1400° C. for 10 min, and quenched by a copper hammer. The quenched sheet was pulverized to form particles having a size of 0.1 to 50 $\mu$m, and the resultant powder was thoroughly stirred and mixed until the $RE_2O_3$ was finely and homogeneously dispersed therein. The mixture was molded into a pellet having a diameter of 30 mm and a height of 30 mm, reheated to 1100° C. for 30 min, cooled to 1000° C. at a cooling rate of 100° C./hr, gradually cooled to 950° C. at a cooling rate of 5° C./hr, and subjected to furnace cooling. Further, to oxygenate the material, the material was held at 600° C. in an oxygen atmosphere of 1 atm for 1 hr.

This sample exhibited a zero electrical resistance temperature of 93K and a high critical current density of 30000 A/cm$^2$ at 77K and 1 tesla (T), as determined by the magnetization method. This critical current density is higher than the 10000 A/cm$^2$ obtained in the case of a sample prepared without pulverization and mixing.

Example 2

In Example 2, a sample was prepared in the same manner as that of Example 1, placed in a platinum crucible, heated at 1300° C. for 20 min, taken out of the furnace, allowed to stand as is in air. The cooled mass was pulverized, and the powder was thoroughly mixed and molded into a pellet having a diameter of 10 mm, and the pellet was reheated to 1150° C., cooled to 1000° C. at a cooling rate of 50° C./hr, gradually cooled to 950° C. at a cooling rate of 2° C./hr, and then subjected to furnace cooling. This sample exhibited a zero electrical resistance temperature of 93K and a high critical current density of 25000 A/cm$^2$ at 77K and 1 T, as determined by the magnetization method.

Example 3

Figure 5:
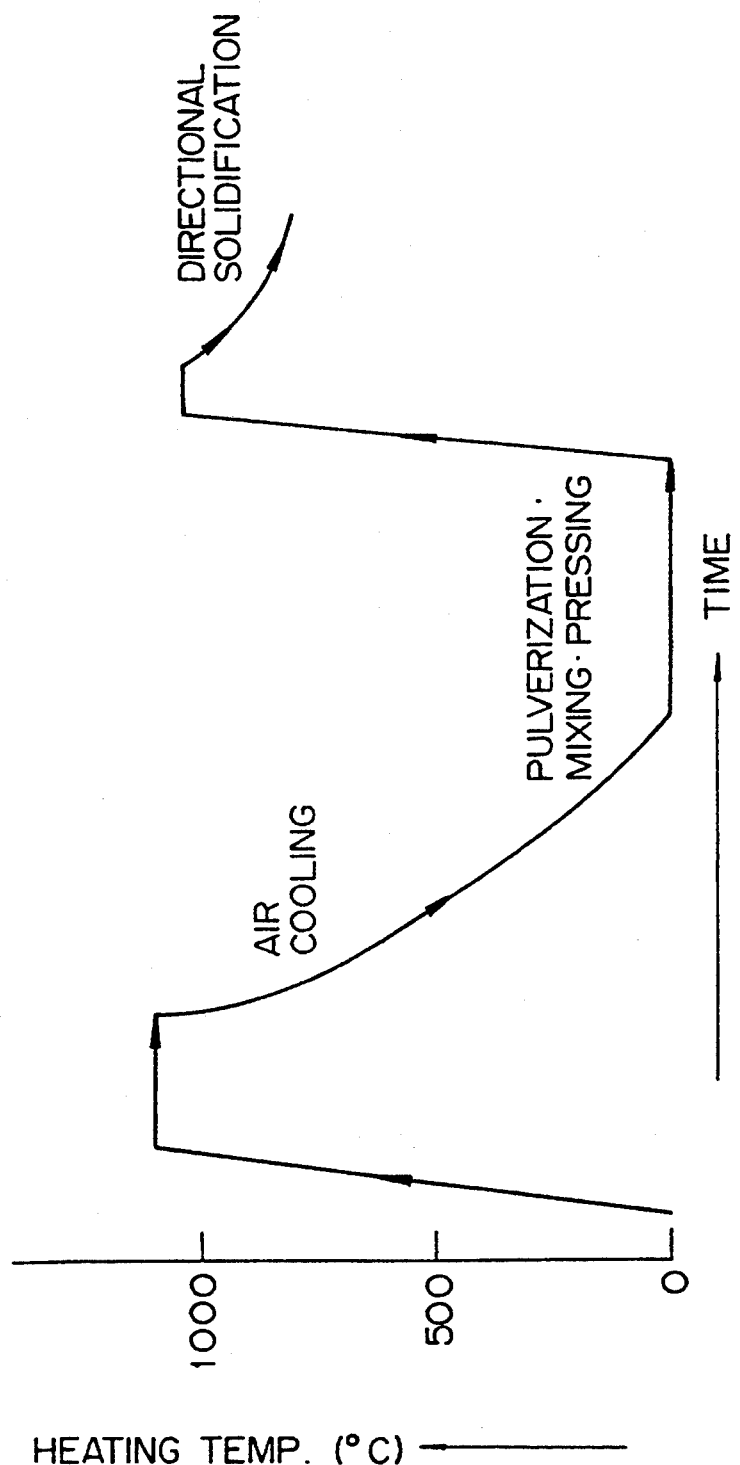
FIG. 5 is a schematic diagram showing a superconductor of a REBaCuO system prepared in Example 3.

In Example 3, an oxide superconductor was prepared as shown in FIG. 5 (a schematic diagram of the process). Specifically, $Ho_2O_3$, $BaCO_3$, and CuO powders as a raw material powder were mixed such that the ratio of Ho, Ba and Cu was 1:2:3, and the mixture was held at 1150° C. for 1 hr and then air-cooled. Thereafter, the cooled mass was pulverized by a jet mill, mixed and molded into a rod sample having a diameter of 10 mm and a length of 50 mm, by an isotropic pressing apparatus (CIP), reheated to 1100° C. for 30 min, cooled to 1000° C. at a cooling rate of 50° C./hr, and then gradually cooled from 1000° to 950° C. at a temperature gradient of 20° C./cm while transferring the rod, whereby a unidirectional superconducting phase was grown. The critical current density ($J_c$) of the material was measured by the four terminal method, using a pulse current source, and was found to be a value of 33000 A/cm² at 77K and 1 T.

Separately, the above-described powder prepared by pulverization by a jet mill was thoroughly mixed and then packed into a flexible tube made of, for example, rubber, copper, silver, etc. The tube was formed into a predetermined shape, such as a rod or coil, and then molded into a sample having a predetermined shape, such as a rod or coil, by an isotropic pressing (CIP) apparatus.

A higher Jc value than that of the conventional superconductor was also obtained when the Ho site was replaced with other lanthanide elements. The results are shown in Table 1.

TABLE 1

| RE in REBaCuO | Jc (A/cm³) |
| --- | --- |
| Y | 30000 |
| $Y_{0.5}Ho_{0.5}$ | 25000 |
| Dy | 28000 |
| Eu | 27000 |
| Sm | 26000 |
| Yb | 15000 |
| Gd | 24000 |
| Er | 28000 |
| Tm | 18000 |
| $Ho_{0.5}Eu_{0.5}$ | 20000 |
| $Dy_{0.5}Sm_{0.5}$ | 20000 |

As apparent from the foregoing description, according to the above-described Examples 1 to 3, an oxide superconductor having a high critical current density can be prepared because, in an oxide superconductor of a REBaCuO system wherein RE is a rare earth element including yttrium, fine $RE_2BaCuO_5$ is homogeneously dispersed in a superconducting phase.

Example 4

$RE_2O_3$, $BaCO_3$ and CuO powders were mixed with each other such that the ratio of RE, Ba and Cu was 1.4:2:3, and presintered in the air at 950° C. for 24 hr. In this case, Y, Ho, Sm, Er, Eu, Gd, Dy, Nd, Tm and Yb were used as RE in a suitable mixing ratio, as shown in Table 2. The preliminary sinter was heated and melted in an alumina crucible at 1300° C. for 20 min, and then sandwiched between copper plates for quenching. Then, the cooled mass was pulverized, and silver was added to the powder in a weight ratio of 0.1 and thoroughly mixed therewith. Thereafter, the mixture was reheated to 1080° C. for 30 min, cooled to 1000° C. at a cooling rate of 80° C./hr, cooled to 950° C. at a cooling rate of 2° C./hr, and taken out and allowed to stand in air for cooling. The cooled mass was heated at 550° C. for 1 hr in an oxygen stream and then subjected to furnace cooling.

All the samples thus prepared exhibited a critical current density Jc of 27000 A/cm² or more at 77K and 1 T, as determined by the magnetization method. A drop test was conducted wherein the sample was dropped from a distance of 1 m above the ground onto a brick. As a result, none of the samples was broken. Further, the thermal conductivity was measured by the liquid nitrogen immersion method. It is possible to compare the thermal conductivity of superconductors through a measurement of time taken from immersion to a stopping of the bubbling (the bubbling stops when the temperature of the superconductor reaches the liquid nitrogen temperature). The above-defined time of the samples containing silver was ¾ of the time of the samples not containing silver. Further, the samples having a liquid nitrogen temperature were taken out and subjected to a measurement of a floatation time on a magnet, and as a result, as in the immersion test, the retention time of the samples containing silver was ¾ of that of the samples not containing silver, i.e., an improvement of the thermal conductivity was exhibited.

TABLE 2

| Composition | Silver oxide o: added x: not added | Jc (77K, 1T) A/cm² × 10⁴ | Drop test o: no cracking x: cracked | Time needed for thermal conductivity test (sec) | |
| --- | --- | --- | --- | --- | --- |
| | | | | cooling | heating |
| $Y_{1.2}$ | x | 2.5 | x | 40 | 80 |
| | o | 2.8 | o | 32 | 61 |
| $Y_{1.0}Ho_{0.2}$ | x | 2.5 | x | 42 | 84 |
| | o | 2.9 | o | 31 | 62 |
| $Y_{1.0}Sm_{0.2}$ | x | 2.7 | x | 45 | 86 |
| | o | 3.0 | o | 32 | 63 |
| $Y_{1.0}Er_{0.2}$ | x | 2.6 | x | 45 | 87 |
| | o | 2.9 | o | 31 | 62 |
| $Y_{1.0}Eu_{0.2}$ | x | 2.7 | x | 44 | 85 |
| | o | 3.1 | o | 31 | 63 |
| $Y_{1.0}Dy_{0.2}$ | x | 2.9 | x | 43 | 84 |
| | o | 3.2 | o | 31 | 61 |
| $Y_{1.0}Nd_{0.2}$ | x | 2.5 | x | 40 | 80 |
| | o | 2.9 | o | 32 | 61 |
| $Y_{1.0}Tm_{0.2}$ | x | 2.5 | x | 41 | 81 |
| | o | 3.0 | o | 31 | 62 |
| $Y_{1.0}Gd_{0.2}$ | x | 2.6 | x | 42 | 83 |
| | o | 2.8 | o | 32 | 62 |
| $Y_{1.0}Yd_{0.2}$ | x | 2.5 | x | 44 | 85 |
| | o | 2.7 | o | 31 | 68 |
| $Ho_{0.6}Eu_{0.6}$ | x | 3.0 | x | 43 | 84 |
| | o | 3.3 | o | 32 | 63 |

Example 5

$BaCO_3$ and CuO as raw material powders were provided at a cation ratio of about 2:3, mixed with each other, presintered at 900° C. for 12 hr, and reheated at 1100° C. A $Y_2O_3$ powder as a raw material was added thereto, and the mixture was held at that temperature for 20 min, cooled to 1000° C. at a cooling rate of 100° C./hr, gradually cooled to 950° C. at a cooling rate of 5° C./hr, and then subjected to furnace cooling. To oxygenate the material, the cooled material was heated at 600° C. for 1 hr in an oxygen atmosphere of 1 atm, and then subjected to furnace cooling. This sample exhibited a zero electrical resistance temperature of 93K and a critical current density of 22000 A/cm$^2$ at 77K and 1 T, as determined by the magnetization method.

Example 6

$BaCO_3$ and $CuO$ were provided as raw material powders, and were mixed with each other at a weight ratio of 3:8. The mixed powder was put on a silver (Ag) tape and heated at 950° C. for 1 hr, to thereby melt the powder. $Y_2O_3$ powder was then added to the melt, while maintaining the melt at 950° C., and the mixture was gradually cooled to 300° C. at a cooling rate of 50° C./hr and allowed to stand for cooling, to thereby form a superconducting phase ($YBa_2Cu_3O_x$). The superconducting sample in the silver tape form exhibited a critical current density of 21000 A/cm$^2$ at 77K and zero tesla, as determined by the four terminal method.

Example 7

$Y_2O_3$, $BaCO_3$ and $CuO$ as raw material powders were provided at a cation ratio of about 1:2:3, mixed with each other, presintered at 900° C. for 24 hr, rapidly heated at 1050° C. and quenched to form a 211 phase Then, $BaCO_3$ and $CuO$ as raw material powders were mixed at a ratio of 3:5, presintered at 900° C. for 12 hr, reheated at 1100° C. the 211 phase prepared above was added thereto, and the mixture was held at that temperature for 20 min, cooled to 1000° C. at a cooling rate of 100° C./hr, gradually cooled to 950° C. at a cooling rate of 5° C./hr, and then subjected to furnace cooling. To oxygenate the material, the material was heated at 600° C. in an oxygen atmosphere of 1 atm, and then subjected to furnace cooling.

This sample exhibited a zero electrical resistance temperature of 93K and a critical current density of 23000 A/cm$^2$ at 77K and 1 T, as determined by the magnetization method.

We claim:

1. A process for preparing an oxide superconductor comprising:

heating to 1200° C. or higher powdered raw material for forming a $REBa_2Cu_3O_x$ type superconductor wherein RE is at least one element selected from the group consisting of Y, Ho, Dy, Eu, Sm, Yb, Gd, Er and Tm, and wherein said heating results in production of a heated material which includes a liquid phase;

cooling the heated material to form a solidified material;

pulverizing and mixing said solidified material to homogeneously disperse said solidified material;

molding the resultant mixed powder into a predetermined shape;

reheating the molding to 1050° C. or higher;

and cooling the reheated material to thereby grow a superconducting phase.

2. A process according to claim 1, wherein said heated material comprises a $RE_2O_3$ phase and a liquid phase, said reheating of said molding is conducted at 1050° to 1200° C. to form a $RE_2BaCuO_5$ phase and a liquid phase, and said cooling of said heated material is conducted to 1000° C. at a cooling rate of 10° to 1000° C./hr, to 950° C. at a cooling rate of 0.2° to 20° C./hr and then to room temperature at a desired cooling rate.

3. A process according to claim 1, wherein said powdered raw material is heated after preliminary calcining.

4. A process according to claim 2, which further comprises, after cooling to room temperature, holding the product at a temperature of 600° to 200° C. for 2 to 200 hr in an oxygen-enriched atmosphere.

5. A process according to claim 1, wherein said powdered raw material is $RE_2O_3$, $BaCO_3$ and $CuO$ powders.

6. A process according to claim 1, wherein said powdered raw material is heated at 1200° C. or higher, cooled for solidification, pulverized, mixed with silver oxide or silver, molded and then reheated.

7. A process for preparing a $REBA_2Cu_3O_x$ type superconductor wherein RE is at least one element selected from the group consisting of Y, Ho, Dy, Eu, Sm, Yb, Gd, Er and Tm, comprising:

mixing powdered $BaCO_3$ and $CuO$;

calcining the mixture at about 900° C.;

heating the mixture at 1100° to 1200° C. to form a melt thereof;

adding $RE_2O_3$ or $RE_2BaCuO_5$ powder to said melt;

holding the mixture at that temperature for a predetermined period of time;

cooling said material to 1000° C. at a cooling rate of 10° to 1000° C./hr and continuously to 950° C. at a cooling rate of 0.2° to 20° C./hr and then to room temperature at a desired cooling rate.

8. A process according to claim 7, wherein said $RE_2BaCuO_5$ powder is provided by a process comprising: mixing powdered raw material of a REBaCuO system, preliminarily sintering the mixture, reheating the sinter to 1050° to 1200° C. to form a 211 phase, cooling the material for solidification, and pulverizing the solidified material.

* * * * *